United States Patent
Lee et al.

(10) Patent No.: US 9,735,208 B2
(45) Date of Patent: Aug. 15, 2017

(54) TRANSPARENT DISPLAY PANEL AND DRIVING METHOD THEREOF

(71) Applicant: Au Optronics Corporation, Hsinchu (TW)

(72) Inventors: Chia-Hwa Lee, Taipei (TW); Hsueh-Yen Yang, Taoyuan County (TW)

(73) Assignee: Au Optronics Corporation, Hsinchu (TW)

( * ) Notice: Subject to any disclaimer, the term of this patent is extended or adjusted under 35 U.S.C. 154(b) by 18 days.

(21) Appl. No.: 14/622,930

(22) Filed: Feb. 16, 2015

(65) Prior Publication Data

US 2016/0064458 A1     Mar. 3, 2016

(30) Foreign Application Priority Data

Aug. 27, 2014   (TW) .............................. 103129512 A

(51) Int. Cl.
*H01L 27/32* (2006.01)
*G09G 3/32* (2016.01)
*G09G 3/3233* (2016.01)

(52) U.S. Cl.
CPC ....... *H01L 27/3218* (2013.01); *G09G 3/3233* (2013.01); *H01L 27/326* (2013.01); *G09G 2300/0426* (2013.01); *G09G 2300/0465* (2013.01)

(58) Field of Classification Search
CPC .......................... G09G 3/3208; H01L 27/3218
USPC ..................................................... 345/76, 694
See application file for complete search history.

(56) References Cited

U.S. PATENT DOCUMENTS

| | | | |
|---|---|---|---|
| 2008/0001525 A1* | 1/2008 | Chao | H01L 27/3216 313/500 |
| 2010/0045189 A1* | 2/2010 | Storch | H05B 37/02 315/149 |

FOREIGN PATENT DOCUMENTS

| | | | |
|---|---|---|---|
| CN | 202736924 | | 2/2013 |
| JP | 07-261166 | | 10/1995 |
| JP | 07261166 A | * | 10/1995 |
| TW | 200802221 | | 1/2008 |
| TW | 201400938 | | 1/2014 |
| TW | 201400938 A | * | 1/2014 |

* cited by examiner

*Primary Examiner* — Amare Mengistu
*Assistant Examiner* — Jennifer Zubajlo
(74) *Attorney, Agent, or Firm* — Jianq Chyun IP Office

(57) ABSTRACT

A transparent display panel including a transparent substrate and a plurality of display units formed on the substrate is provided. Each of the display units includes a color light area and a least one of transparent areas disposed around the color light area. The color light area has a geometric center, a first color pixel structure, a second color pixel structure, and a third color pixel structure. The first, second and third color pixel structures take the geometric center as a center in each display unit and are disposed in a radial way corresponding to the center to form the color light area.

17 Claims, 11 Drawing Sheets

TRANSPARENT DISPLAY PANEL AND DRIVING METHOD THEREOF

CROSS-REFERENCE TO RELATED APPLICATION

This application claims the priority benefit of Taiwan application serial no. 103129512, filed on Aug. 27, 2014. The entirety of the above-mentioned patent application is hereby incorporated by reference herein and made a part of this specification.

BACKGROUND OF THE INVENTION

1. Field of the Invention

The present invention generally relates to display panel and driving method thereof, in particular, to transparent display panel and driving method thereof.

2. Description of Related Art

Transparent display panel is referring to a display panel, which is transparent at certain level for allowing the background behind the display panel to be clearly seen. The transparent display panel is suitable for use in architecture's window, car's window, window for window shopping, and so on. In addition to the property of the transparent display panel, it can be an information display in the future, as in the potential development, and therefore has been much concerned in the market.

In the current state for the transparent display panel, the display unit can be usually divided as color light area and transparent area, and the color light area are usually formed by pixel structures. However, in order to allocate sufficient area in the display unit to serve as transparent area, so to have sufficient transparency, the size of the pixel structure (or color light area) is restricted. This restriction would affect the pixel density of the transparent display panel. Thus, it would be an important issue in the art to effectively implement the pixel structure in the region of the display unit, so that the transparent display panel can have high pixel density with the request of high transparency.

SUMMARY OF THE INVENTION

The present invention is directed to a transparent display panel, which can have high pixel density and better transparency.

The present invention provides a driving method of the transparent display panel, in which the pixel structure is effectively used, so the transparent display panel has high pixel density.

The present invention provides a transparent display panel, which includes a transparent substrate and a plurality of display units disposed on the transparent substrate. Each of the display units includes a color light area and at least one transparent area disposed around the color light area. The color light area has a geometric center, a first color pixel structure, a second color pixel structure and a third color pixel structure. The first, second and third color pixel structures take the geometric center as a center, and are disposed with respect to the center by a radial way to form the color light area.

The present invention provides a transparent display panel, which includes a transparent substrate and at least one display unit, at least one second display unit, and at least one third display unit disposed on the transparent substrate. The first, second, and third display units respectively include a first color pixel structure, a second color pixel structure, a third color pixel structure. The first color pixel structure, the second pixel structure and the third pixel structure have a geometric center, and the first color pixel structure, the second pixel structure and the third pixel structure are disposed in a radial way with respect to the geometric center. The third color pixel structure of the first display unit, the second color pixel structure of the second display unit, and the first color pixel structure of the third display unit form as an auxiliary display unit.

The present invention provides a driving method of transparent display panel, including the following steps. A transparent substrate is provided. The transparent substrate includes a plurality of scanning lines, a plurality of first, second, and third data lines and a plurality of first, second, and third color pixel structures, wherein each of the first, second, and third data lines respectively is electrically connected to one of the scanning lines and one of the first, second, and third data lines. One first color pixel structure, one second color pixel structure and one third color pixel structure are electrically connected to the same scanning line to form a display unit. In the first driving sequence, the first, second, and third color pixel structures are driven by the scanning lines with a plurality of the first, second, and third data lines, to cause the corresponding display unit to emit light. In a second driving sequence, two adjacent scanning lines form as a virtual scanning line, and the first, second, and third color pixel structures are driven by the virtual scanning lines with a plurality of the first, second, and third data lines, to form a plurality of auxiliary display units, wherein each of the auxiliary display units includes one first color pixel structure, one second color pixel structure, and one third color pixel structure. The first, second, and third color pixel structures of each of the auxiliary display units are formed from the adjacent three display units, each of which respectively provides one of the first, second, and third color pixel structures.

Accordingly, in the transparent display panel of the invention, the first, second, and third color pixel structures of each of the display units take the geometric center as the center, and disposed in radial way with respect to the center. By a specific driving sequence, the auxiliary display unit can be formed from three display units, so the transparent display panel can have both of high transparency and high pixel density.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
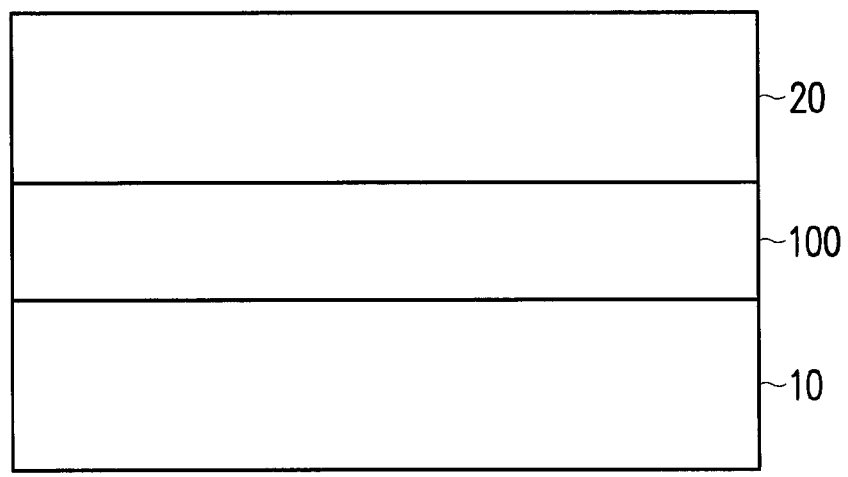
FIG. 1 is a drawing, schematically illustrating a cross-sectional view of the transparent display panel, according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a drawing, schematically illustrating a cross-sectional view of the transparent display panel, according to an embodiment of the invention. Referring to FIG. 1, the transparent display panel 50 includes a transparent substrate 10, transparent cap layer 20 and a pixel array layer 100.

The transparent substrate 10 is a transparent material as usual, such as glass, quartz, organic compound, or any other suitable material. The transparent cap layer 20 is disposed a side opposite to the transparent substrate 10. The transparent cap layer 20 is transparent material as usual, such as glass, quartz, organic compound, or any other suitable material. In a further embodiment, a sealant is between the transparent substrate 10 and the transparent cap layer 20 for affixing the pixel array layer 100 with other material between the transparent substrate 10 and the transparent cap layer 20. The sealant can be frit material, UV glue, acrylic resin, or epoxy resin.

The pixel array layer 100 is disposed on the transparent substrate 10. In the embodiment, the pixel array layer 100 includes a plurality of display units, a plurality of scanning lines, a plurality of data lines, a plurality of control devices and a plurality of light emitting devices. In the following descriptions, the implementation of the foregoing devices and the circuit layout of the pixel array layer are to be described in further detail.

Remarkably, the term of "geometric center" in the descriptions is usually referring to a symmetric center for multiple polygons as a whole. The geometric center may be located within the polygons or outside the polygons. For example, when geometric center of the multiple color pixel structures is stated, the geometric center is a symmetric center for the whole structure of the color pixel structures, each of which is in polygon. This geometric center may be located at the inner region or the outer region of the multiple color pixel structures. However, when the center or central location is used in the specification, it represents a central region inside the device. For example, when the term of central location is referred, it refers to the central region inside the display unit. Further, when the term of meeting point is referred, it refers to the location at which multiple devices are connected to one another. For example, the meeting point of the multiple color pixel structures is referring to a location at which the multiple devices are connected to one another.

First Embodiment

Figure 2:
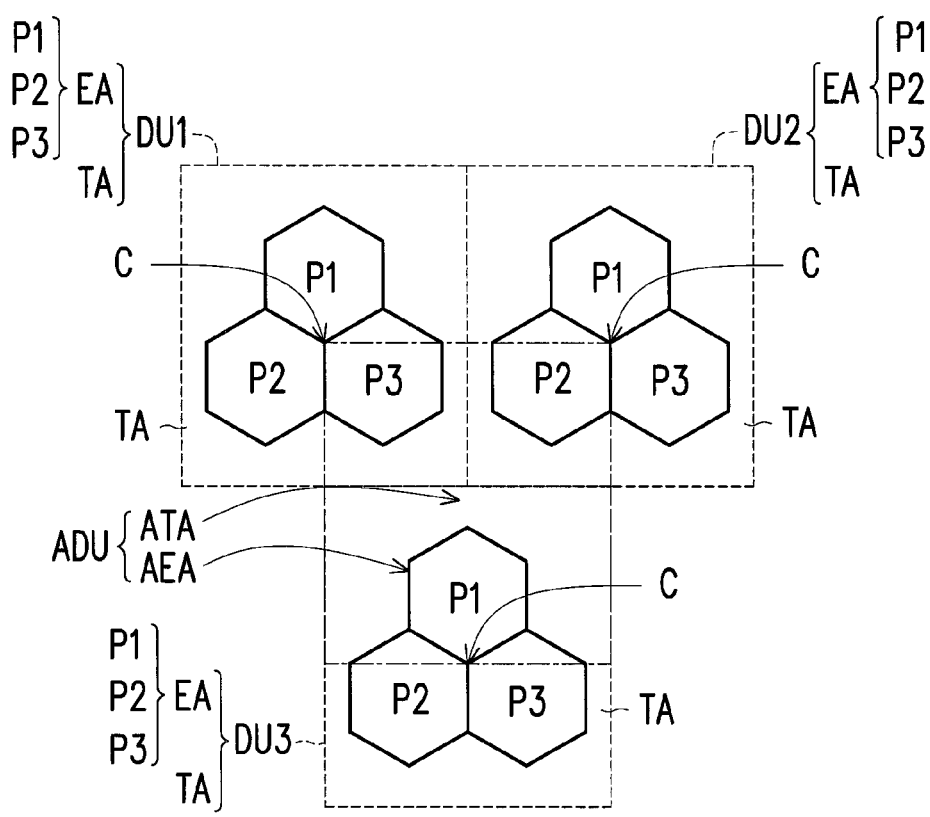
FIG. 2 is a drawing, schematically illustrating a top view of pixel array layer, according to an embodiment of the invention.

FIG. 2 is a drawing, schematically illustrating a top view of pixel array layer, according to an embodiment of the invention. To clearly describe the embodiment of the invention, a partial region of the pixel array layer 100 is shown in FIG. 2. The one with the ordinary skill in the art can understand that the pixel array layer 100 is formed from a plurality of partial regions of FIG. 2, which are have been properly grouped and arranged in locations.

Referring to FIG. 2, the pixel array layer 100 includes at least one first display unit DU1, at least one second display unit DU2, and at least one third display unit DU3. The first and second display units DU1 and DU2 can be located at the same row and the third display unit DU3 can be located at another adjacent row. The first, second, and third display units DU1-DU3 form a triangular arrangement.

The first display unit DU1, the second display unit DU2 and the third display unit DU3 respectively include a color light area EA and a transparent area TA. The transparent area TA is located at a periphery of the color light area EA. In better detail, the transparent area TA in the embodiment is surrounding the periphery of the color light area EA. The color light area EA has a geometric center C, a first color pixel structure P1, a second color pixel structure P2, and a third color pixel structure P3. The first, second, third color pixel structures P1-P3 take the geometric center C as the center and are disposed in radial way with respect to the center. The center is located at the central location in each of the display units DU1-DU3. The three pixel structures form the color light area EA. In better detail, when the first, second, and third color pixel structures P1-P3 are connected with a meeting point, the first, second, and third color pixel structures P1-P3 can be the radial form with respect to their geometric center C. The geometric center C can match to the meeting point of the first, second, and third color pixel structures P1-P3. However, the invention is not just limited to the arrangement. In other embodiment, the first, second, and third color pixel structures P1-P3 may not be connected to one another but still disposed in radial way with respect to the geometric center C.

In the embodiment of FIG. 2, to easily describe, the first, second, and third color pixel structures P1-P3 are shown in hexagon and are arranged in a sequence of counter clockwise. However, the invention is not just limited to this. In other embodiment, the first, second, and third color pixel structures can be circular, rectangular, or any other proper shape, and the sequence can be any arrangement, such as clockwise or random manner. In general, the color light area EA is formed from the first, second, and third pixel structures P1-P3. The color light area EA in the pixel array layer 100 is usually used to actually display the image. Differently, no color pixel structure is implemented within the transparent area TA, so the light from outside can transmit the transparent area TA and the observer of the transparent display panel can see the background behind the transparent display panel.

In the embodiment, the first, second, and third color pixel structures P1-P3 are centralized to locate at the central location of each display unit. The transparent area TA is between the color light area EA of each display unit and the color light area EA of any adjacent display unit, so the color light area EA of each display unit is disconnected from the color light area EA of any adjacent display unit. The transparent area TA can be centralized to locate at the meeting point between two adjacent display units. The light is easily transmitting the transparent area TA, so the transparent display panel has better transparency.

In the embodiment, the third color pixel structure P3 of the first display unit DU1, the second color pixel structure P2 of the second display unit DU2 and the first color pixel structure P1 of the third display unit DU3 form an auxiliary unit ADU. The central location of the auxiliary unit ADU can be the transparent area ATA and its peripheral area can be color light area AEA. In better clarity, a transparent area TA respectively exits at one end of the third color pixel structure P3 of the first display unit DU1, one end of the second color pixel structure P2 of the second display unit DU2 and one end of the first color pixel structure P1 of the third display unit DU3. As a result, when the first, second. And third display units DU1-DU3 form the auxiliary display unit ADU, a part of each transparent area TA forms the transparent area ATA at the central location of the auxiliary display unit ADU. The third color pixel structure P3 of the first display unit DU1, the second color pixel structure P2 of the second display unit DU2 and the first color pixel structure P1 of the third display unit DU3 form the color light area at peripheral area of the auxiliary display unit ADU.

Figure 3:
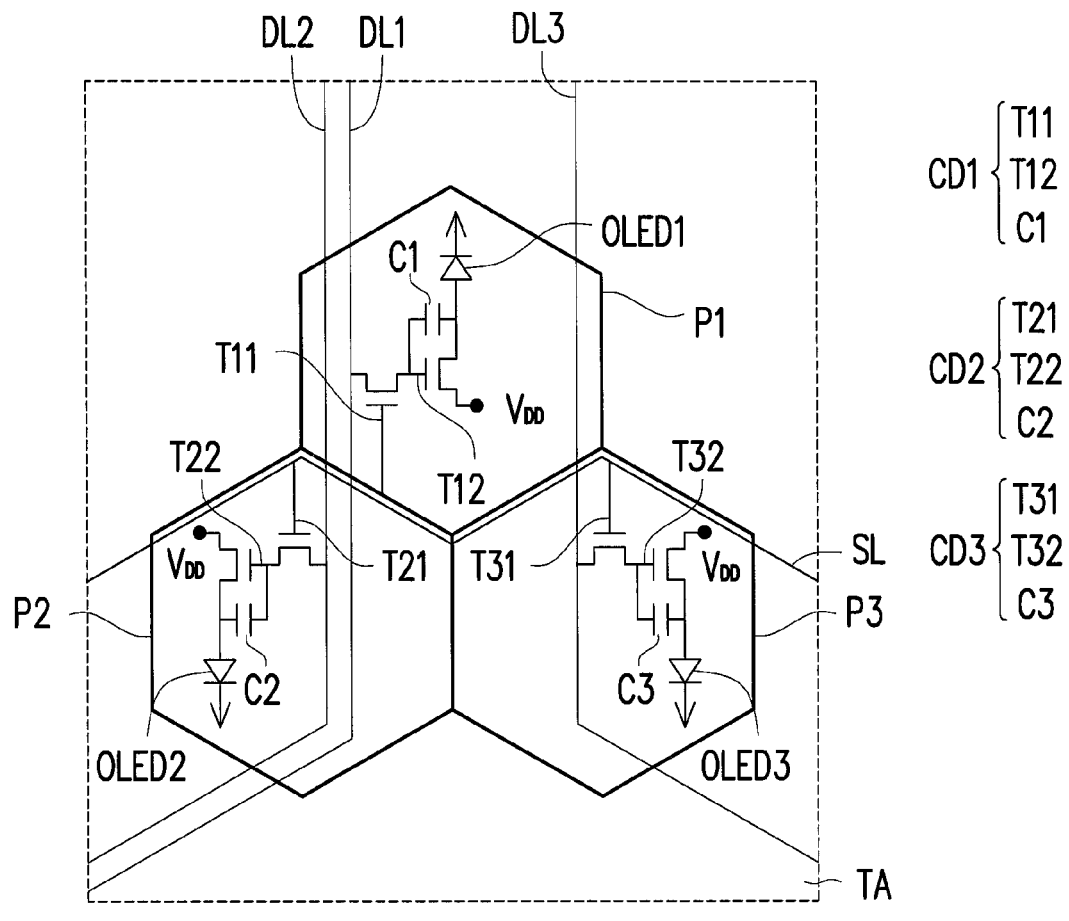
FIG. 3 is a drawing, schematically illustrating an equivalent circuit of one display unit in FIG. 2.

FIG. 3 is a drawing, schematically illustrating an equivalent circuit of one display unit in FIG. 2. To easily describe, only the first display unit DU1 is shown in FIG. 2 as an example. However, as known by the one with ordinary skill in the art, the display units in the embodiment have the similar or the same equivalent circuit. In addition, the equivalent circuit in FIG. 3 is just for an example, not for limiting device or the circuit path of the invention.

Referring to FIG. 3, in the first display unit DU1, the first color pixel structure P1 includes a first control device CD1 and a first light emitting device OLED1, electrically connected to the first control device CD1. The first control device CD1 is also electrically connecting to scanning line SL and the first data line DL1. The second color pixel structure P2 includes a second control device CD2 and a second light emitting device OLED2, electrically connected to the second control device CD2. The second control device CD2 is also electrically connecting to scanning line SL and the second data line DL2. The third color pixel structure P3 includes a third control device CD3 and a third light emitting device OLED3, electrically connected to the third control device CD3. The third control device CD3 is also electrically connecting to scanning line SL and the third data line DL3. The first display unit DU1 can further include a plurality of power lines (not shown) and the power lines respectively and electrically connects to the first, second, third light emitting devices OLED1-OLED3 via the connection terminal VDD. In the embodiment, since the first, second, third control devices CD1-CD3 and the first, second, third light emitting devices OLED1-OLED3 are at the color light area, formed from the color pixel structures of the first display unit DU1, no control device and light emitting device are implemented at the transparent area TA, so the transparent display panel has better transparency.

In addition, in the embodiment, each of the color pixel structures P1-P3 is implemented with two active devices with a capacitor, as an example for 2T1C. In other words, the first control device CD1 of the first color pixel structure P1 includes active device T11, active device T12 and capacitor C1, in which the first control device CD1 is electrically connected to the scanning line SL and the first data line DL1 via the active device T11. The second control device CD2 of the second color pixel structure P2 includes active device T21, active device T22 and capacitor C2, in which the second control device CD2 is electrically connected to the scanning line SL and the second data line DL2 via the active device T21. The third control device CD3 of the third color pixel structure P3 includes active device T31, active device T32 and capacitor C3, in which the third control device CD3 is electrically connected to the scanning line SL and the third data line DL3 via the active device T31. However, the invention is not just limited to this arrangement. In other embodiment, each of the color pixel structures P1-P3 can have any the proper number of the active device and the capacitor.

Figure 4:
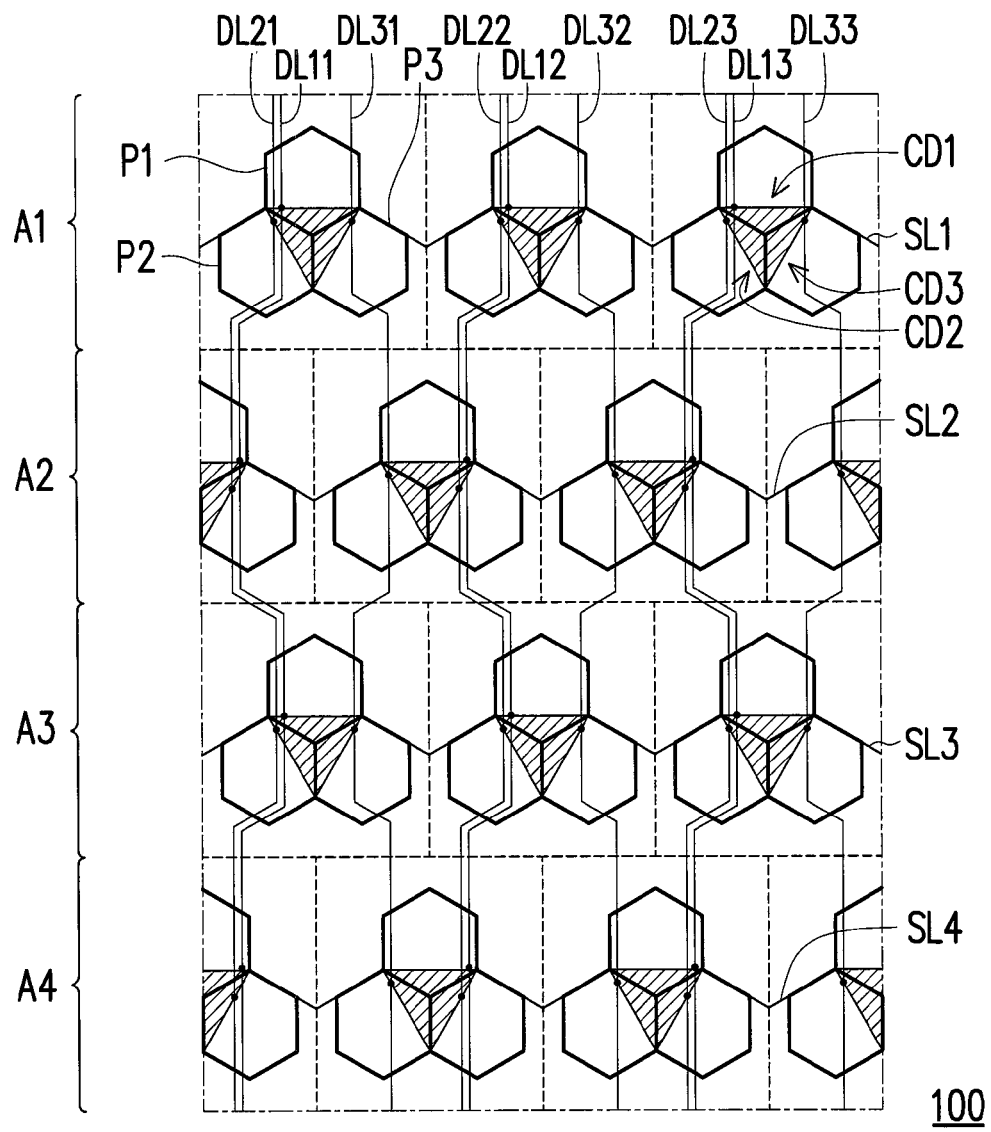
FIG. 4 is a drawing, schematically illustrating a top view of the circuit layout of the pixel array layer, according to an embodiment of the invention.

FIG. 4 is a drawing, schematically illustrating a top view of the circuit layout of the pixel array layer, according to an embodiment of the invention. To easily describe, only a part of the pixel array layer 100 is shown in FIG. 4 but one with ordinary skill in the art can understand that the pixel array layer 100 can be formed by a plurality of parts as shown in FIG. 4 being properly grouped and arranged in location.

Referring to FIG. 4, the pixel array layer 100 includes a plurality of scanning lines SL1-SL4, a plurality of first data lines DL11-DL13, a plurality of second data lines DL21-DL23 and a plurality of third data lines DL31-DL33. The row of the scanning line is electrically connected with all of the color pixel structures of the same row as the scanning line SL. For example, the scanning line SL1 at the row A1 is electrically connected with all of the color pixel structures in the row A1. The scanning line SL2 at the row A2 is electrically connected with all of the color pixel structures in the row A2. The scanning line SL3 at the row A3 is electrically connected with all of the color pixel structures in the row A3. The scanning line SL4 at the row A4 is electrically connected with all of the color pixel structures in the row A4.

Each data line is electrically connected to each corresponding one of the color pixel structures at different rows via the corresponding one of the control devices at different rows. For example, the first data lines DL11-DL13 respectively are electrically connected with the corresponding first color pixel structures P1 at the rows A1-A4 via the corresponding control devices CD1 at the rows A1-A4. The second data lines DL21-DL23 respectively are electrically connected with the corresponding second color pixel structures P2 at the rows A1-A4 via the corresponding control devices CD2 at the rows A1-A4. The third data lines DL31-DL33 respectively are electrically connected with the corresponding third color pixel structures P3 at the rows A1-A4 via the corresponding control devices CD3 at the rows A1-A4. In the embodiment, it can have various configurations for the color pixel structures in each row, depending on the circuit layout. For example, to respectively connect the second data lines DL22 and DL 32 to the second color pixel structure P2 and the third color pixel structure P3 in the row A1 and the row A2, the arrangement in location for the row A1 and the row A2 would be different. However, the invention is not limited to this arrangement. In other embodiment, the circuit layout can be changed to have the same arrangement in location for the color pixel structures in each row. In addition, although the power line is not shown in FIG. 4 for easy description, the one with ordinary skill in the art can understand that the power lines in any proper manner can be implemented in the pixel array layer 100.

For better clarity, in the embodiment, each first color pixel structure P1 includes a first control device CD1, and the control device CD1 is electrically connected to the scanning line at the same row and the corresponding first data lines. Each second color pixel structure P2 includes a second control device CD2, and the control device CD2 is electrically connected to the scanning line at the same row and the corresponding second data lines. Each third color pixel structure P3 includes a third control device CD3, and the control device CD3 is electrically connected to the scanning line at the same row and the corresponding third data lines. As a result, when a specific color pixel structure is intended to emit light, driving voltages can be applied to the scanning line at the same row as the color pixel structure and the corresponding data line, to cause the light emitting device in the color pixel structure to be activated to emit the corresponding color light.

As described above, the embodiment has described the configuration of the device and the circuit layout in the pixel structure layer. A driving method for the display panel of the embodiment is to be further described as follows.

Figure 5A:
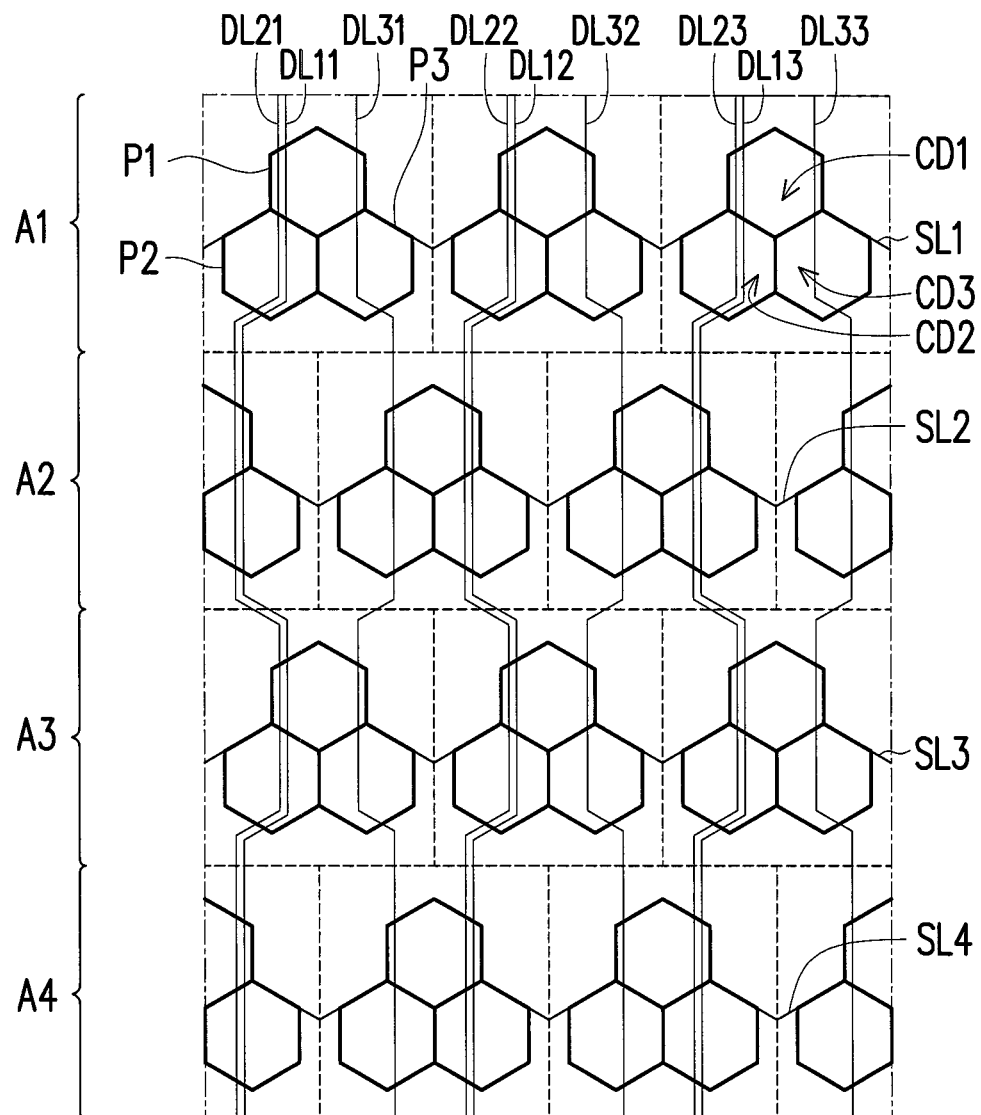
FIG. 5A and FIG. 5B are drawings, schematically illustrating top views of pixel structure layer of the transparent display panel when at the first driving sequence and the second driving sequence, according to an embodiment of the invention.
Figure 5B:
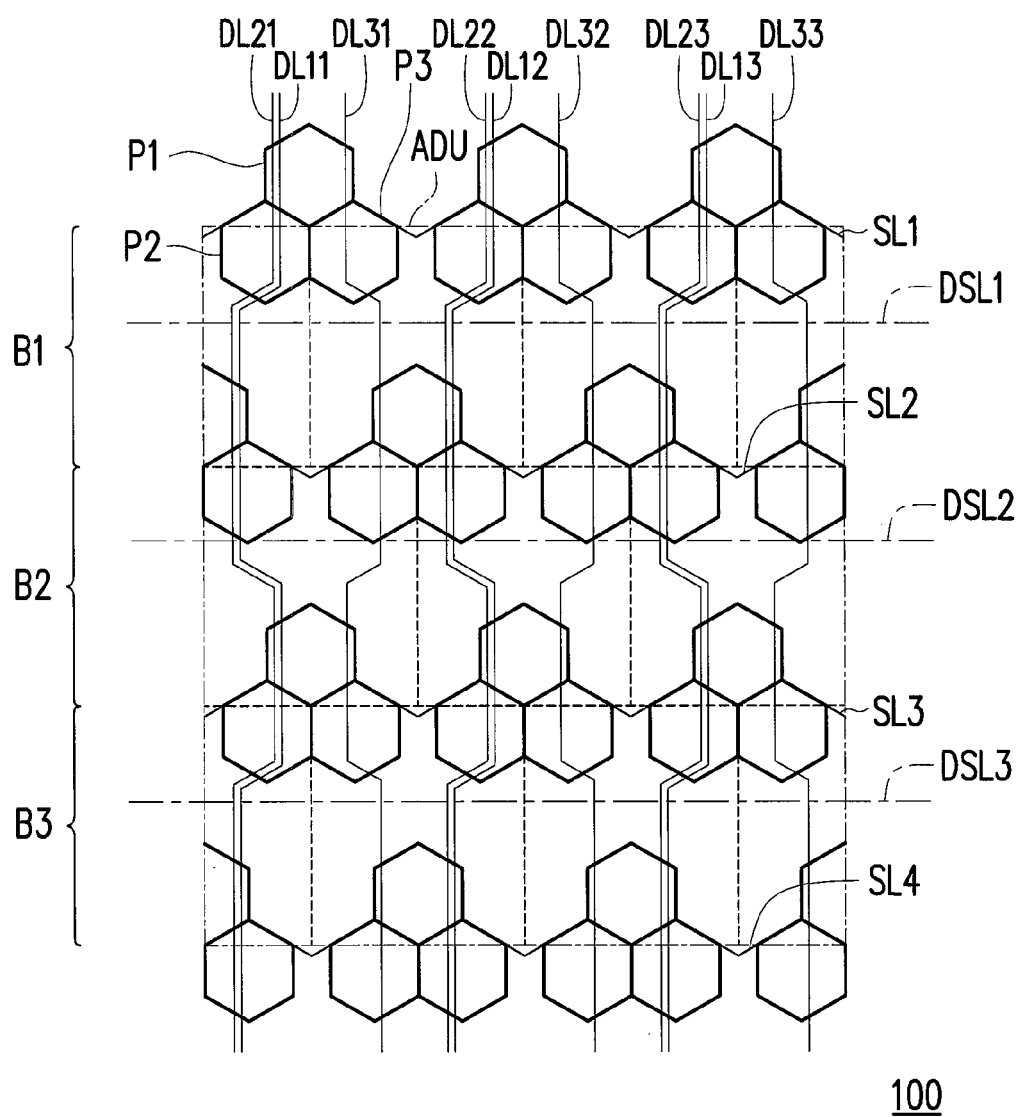

FIG. 5A is a drawing, schematically illustrating top views of pixel structure layer in FIG. 4 when at the first driving sequence. FIG. 5B is a drawing, schematically illustrating top views of pixel structure layer in FIG. 4 when at the second driving sequence. In addition, to easily describe, only the color pixel structure, scanning line and data line in the display unit are shown in FIG. 5A and FIG. 5B. One with ordinary skill in the art can understand that the display unit can further include control device, light emitting device, power line and/or other devices.

Referring to FIG. 5A, the structure and the layout of the pixel array layer 100 are described in foregoing descriptions. In other words, the pixel array layer 100 includes a plurality of scanning lines SL1-SL4, a plurality of first data lines DL11-DL13, a plurality of second data lines DL21-DL23, a plurality of third data lines DL31-DL33, and a plurality of first, second and third color pixel structures P1-P3. Each first color pixel structure P1 is electrically connected to one of the scanning lines SL1-SL4 and one of the first data lines DL11-DL13. Each second color pixel structure P2 is electrically connected to one of the scanning lines SL1-SL4 and one of the second data lines DL21-DL23. Each third color pixel structure P3 is electrically connected to one of the scanning lines SL1-SL4 and one of the third data lines DL31-DL33. One of the first color pixel structures P1, one of the second color pixel structures P2, and one of the third color pixel structures P3 are electrically connected to the same one of the scanning lines SL1-SL4, to form a display unit.

In a first driving sequence, the driving voltages can be applied to the scanning lines SL1-SL4, the first data lines DL11-DL13, the second data lines DL21-DL23, and the third data lines DL31-DL33 to drive the corresponding first, second, and third color pixel structures. P1-P3, to cause the corresponding display unit to emit light. For example, in FIG. 5A, the driving voltages are applied to the scanning lines SL1-SL4, the first data lines DL11-DL13, the second data lines DL21-DL23, and the third data lines DL31-DL33 to cause the display unit in the row A1, the display unit in the row A2, the display unit in the row A3 and the display unit in the row A4 to emit light according to the driving signals.

Referring to FIG. 5B, in the second driving sequence, two adjacent scanning lines form as a virtual scanning line, and the first, second, and third color pixel structures P1-P3 are driven by the virtual scanning line with the first, second, and third data lines, to form auxiliary display unit ADU. In better detail, during the second driving sequence, the virtual scanning line DSL1 can be formed by applying voltages to the scanning line SL1 and the scanning line SL2; the virtual scanning line DSL2 can be formed by applying voltages to the scanning line SL2 and the scanning line SL3; and the virtual scanning line DSL3 can be formed by applying voltages to the scanning line SL3 and the scanning line SL4. In the second driving sequence, all the color pixel structures P1-P3 in the rows B1-B3 can be driven by the foregoing virtual scanning lines DSL1-DSL3, the first data lines DL11-DL12, the second data lines DL21-DL23, and the third data lines DL31-DL33, so a plurality of auxiliary display units ADU can be formed in the rows B1-B3.

As described above, each auxiliary display unit ADU includes one first color pixel structure P1, one second color pixel structure P2, and one third color pixel structure P3. The first, second, and third pixel structures P1-P3 in each auxiliary display unit ADU are formed by one first color pixel structure P1, one second color pixel structure P2 and one third color pixel structure P3 respectively from the three adjacent display units, as shown in FIG. 2.

According to the foregoing descriptions, in the transparent display panel of the invention, the auxiliary display unit can be formed by the color pixel structures of the display unit with the color pixel structures of another adjacent display unit. Further, based on the diving sequence in the invention, the display unit and the auxiliary display unit can be simultaneously driven. So, the auxiliary display unit can provide additional color light area to the original color light area. The pixel density of the transparent display panel can be increased. Further, since the color pixel structures in the invention are centralized at the central location of the display unit, the transparent areas can also be gathered accordingly, and thereby the transparent display panel has better transparency.

Second Embodiment

Figure 6:
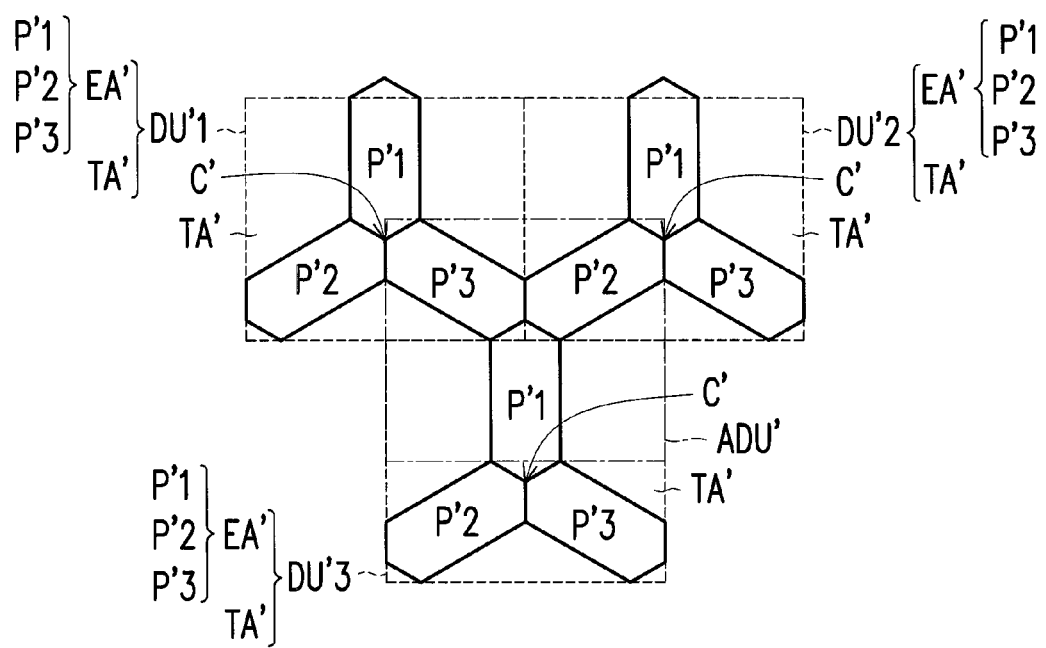
FIG. 6 is a drawing, schematically illustrating a top view of pixel array layer, according to another embodiment of the invention.

FIG. 6 is a drawing, schematically illustrating a top view of pixel array layer, according to another embodiment of the invention. The pixel array layer in FIG. 6 is similar to the pixel array layer in FIG. 2. The difference of the embodiment in FIG. 6 is that one end for each of the first, second, third color pixel structures P'1-P'3 is gathered to the central location of the display unit with connection to one another. Another end for each of the first, second, third color pixel structures P'1-P'3 is connected with one of the first, second, third color pixel structures P'1-P'3 in the adjacent display unit at the central location of the auxiliary display unit ADU'.

In better detail, in each of the first display unit DU'1, the second display unit DU'2, and the third display unit DU'3, one end of each of the first, second, third color pixel structures P'1-P'3 is located at the central location (e.g. the geometric center C' of the first, second, third color pixel structures P'1-P'3) of the display unit to which they belong for connecting to one another. Further, another ends of the third color pixel structure P'3 of the first display unit DU'1, the second color pixel structure P'2 of the second display unit DU'2, and the first color pixel structure P'1 of the third display unit DU'3 form an auxiliary display unit ADU'. The third color pixel structure P'3 of the first display unit DU'1, the second color pixel structure P'2 of the second display unit DU'2, and the first color pixel structure P'1 of the third display unit DU'3 are connected to one another at the central location of the auxiliary display unit ADU'.

Figure 7:
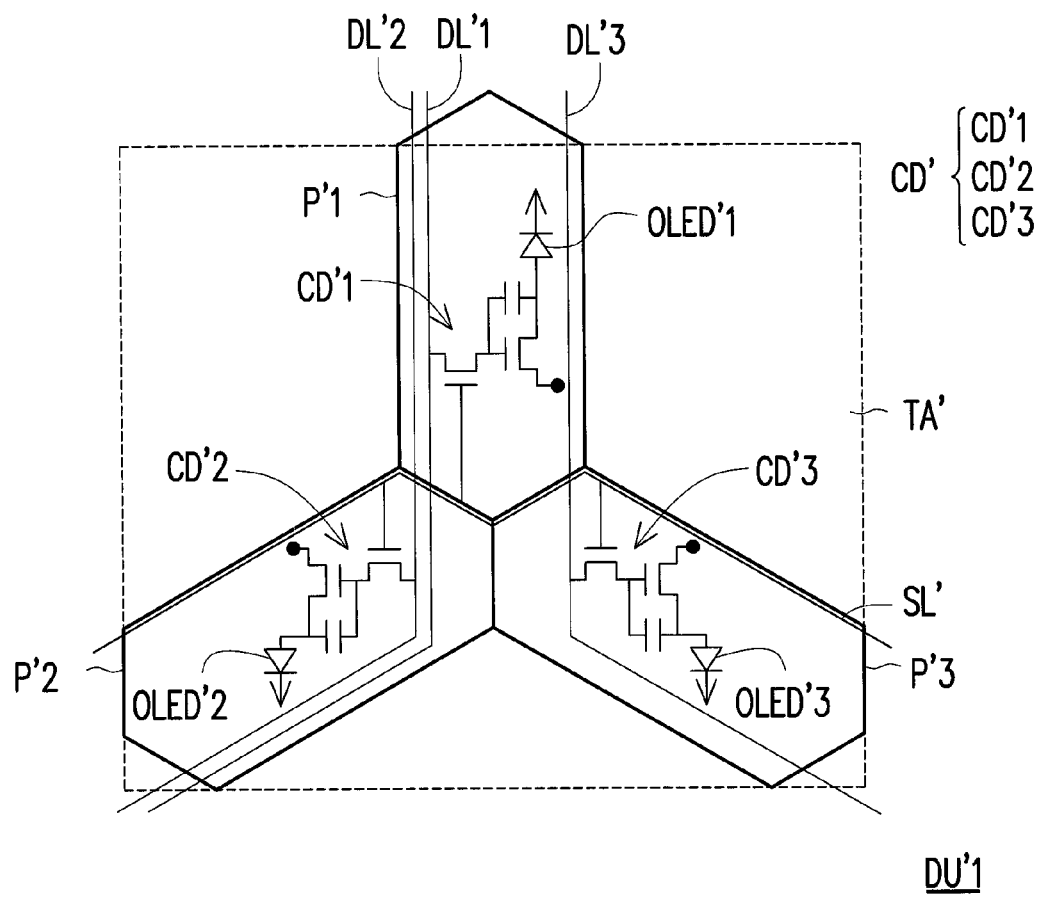
FIG. 7 is a drawing, schematically illustrating an equivalent circuit of one display unit in FIG. 6.

FIG. 7 is a drawing, schematically illustrating an equivalent circuit of one display unit in FIG. 6. To easy describe, FIG. 7 only shows the first display unit DU'1 as an example. However, the one with ordinary skill in the art can understand that all the display units have similar or even identical equivalent circuit in the embodiment. In addition, the equivalent circuit in FIG. 7 is just an example but not for limiting the device or the circuit layout.

Referring to FIG. 7, the first display unit DU'1 includes scanning line SL', a first data line DL'1, a second data line DL'2 and a third data line DL'3. In the display unit DU'1, the first color pixel structure P'1 includes a first control device CD'1 and a first light emitting device OLED'1, electrically connected together. The first control device CD'1 is electrically connected to the scanning line SL' and the first data line DL'1. The second color pixel structure P'2 includes a second control device CD'2 and a second light emitting device OLED'2, electrically connected together. The second control device CD'2 is electrically connected to the scanning line SL' and the second data line DL'2. The third color pixel structure P'3 includes a third control device CD'3 and a third light emitting device OLED'2, electrically connected together. The third control device CD'3 is electrically connected to the scanning line SL' and the third data line DL'3. Further, in the embodiment, the first display unit DU'1 can include a plurality of power lines (not shown), electrically connected with the light-emitting device OLED'1-OLED'3.

Further, in the embodiment, each of the color pixel structures P'1-P'3 can be implemented by two active devices with one capacitor (2T1C), as an example. In other words, each of the first, second, and third control devices CD'1-CD'3 includes two active devices and one capacitor, similar or identical to the first, second, and third control devices CD1-CD3 in FIG. 3. However, the invention is not limited to this manner. In other embodiment, each of the color pixel structures P'1-P' can have the proper number of active devices and capacitors.

Figure 8:
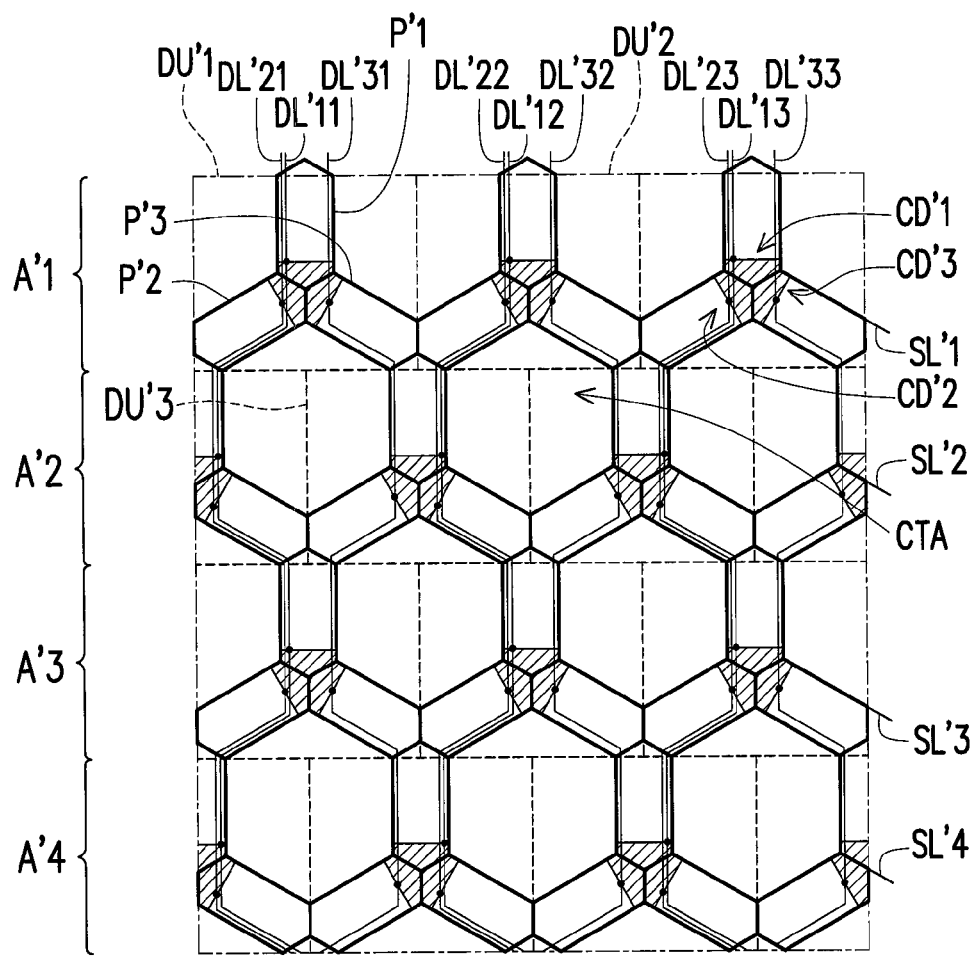
FIG. 8 is a drawing, schematically illustrating a top view of the circuit layout of the pixel array layer, according to another embodiment of the invention.

FIG. 8 is a drawing, schematically illustrating a top view of the circuit layout of the pixel array layer, according to another embodiment of the invention. The pixel array layer in FIG. 8 is similar to that in FIG. 4. The difference between them is that the scanning lines SL'1-SL'4, the first data line DL'11-DL'13, the second data lines DL'21-DL'23, and the third data lines DL'31-DL'33 in FIG. 8 are all disposed within the color light area. Further, the pixel structure layer 200 in the embodiment includes a plurality of closed-form transparent areas CTA.

In better detail, in the second embodiment, since two ends of the color pixel structures P'1-P'3 are connected to each other, the scanning lines SL'1-SL'4, the first data line DL'11-DL'13, the second data lines DL'21-DL'23, and the third data lines DL'31-DL'33 can all implemented within the color light area, formed from the color pixel structures P'1-P'3. The transparent area of the transparent display panel can be increased, thereby.

Further, in the embodiment, each of the first, second, third color pixel structures P'1-P'3 of each display unit respectively connects to one of the first, second, third color pixel structures in the adjacent display unit, so that a plurality of closed-form transparent areas CTA can be defined out. In better detail, each of the first, second, third color pixel structures P'1-P'3 in each of the first, second, third display units DU'1-DU'3 is respectively connected to one of the of the first, second, third color pixel structures P'1-P'3 in the adjacent display units, so that a plurality of closed-form transparent areas CTA can be defined out. The closed-form transparent area CTA is an area formed by gathering the transparent areas in each display unit, so the closed-form transparent areas CTA can have better transparency for the transparent display panel.

Similar to the first embodiment, the pixel structure layer 200 in the embodiment includes a plurality of first control devices CD'1, a plurality of second control devices CD'2, and a plurality of third control devices CD'3. The scanning lines SL'1-SL'4 in the row A'1-A'4 electrically connects all of the color pixel structures in the same row via the first, second, and third control devices CD'1-CD'3. The first data lines DL'11-DL'13 are respectively and electrically connected to the corresponding first color pixel structures P'1 in the rows A'1-A'4 via the corresponding first control devices CD'1. The second data lines DL'21-DL'23 are respectively and electrically connected to the corresponding second color pixel structures P'2 in the rows A'1-A'4 via the corresponding second control devices CD'2. The third data lines DL'31-DL'33 are respectively and electrically connected to the corresponding third color pixel structures P'3 in the rows A'1-A'4 via the corresponding third control devices CD'3. As a result, when a specific color pixel structure is intended to emit light, driving voltages can be applied to the scanning line at the same row as the color pixel structure and the corresponding data line, to cause the light emitting device in the color pixel structure to be activated to emit the corresponding color light. Further similar to the first embodiment, in the embodiment, the circuit layout can be changed to have different arrangement in location for the color pixel structures in each row. Alternatively, the arrangement in location for the color pixel structures in each row can be changed to have different circuit layout.

The driving method of the transparent display panel in the embodiment is further described as follows.

Figure 9A:
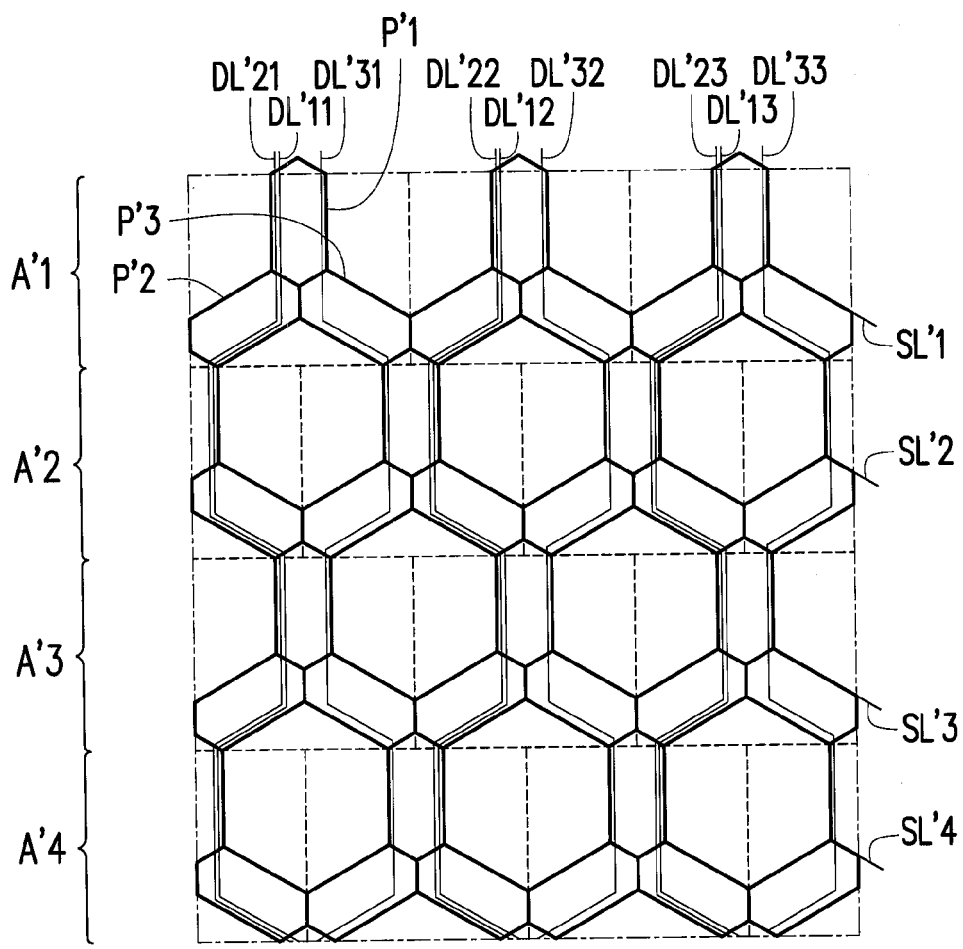
FIG. 9A and FIG. 9B are drawings, schematically illustrating top views of pixel structure layer of the transparent display panel when at the first driving sequence and second driving sequence, according to another embodiment of the invention.
Figure 9B:
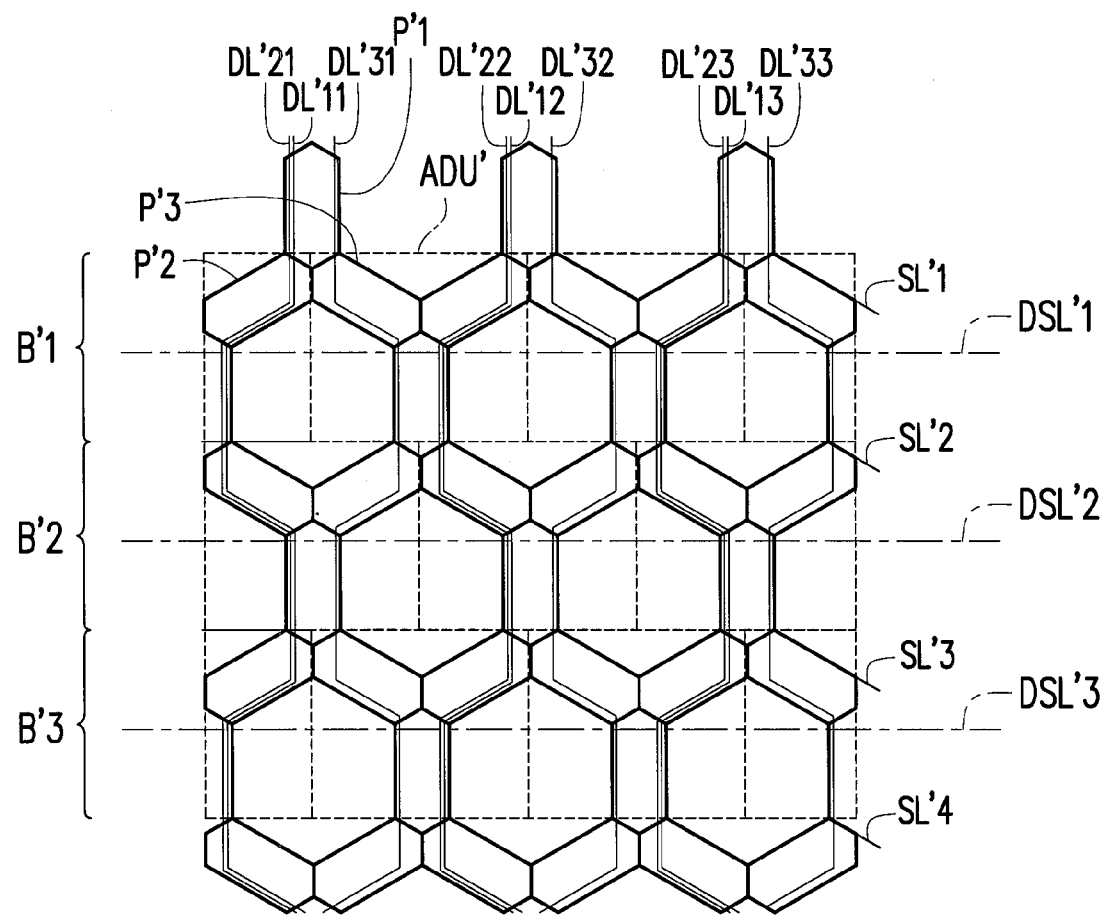

FIG. 9A is a drawing, schematically illustrating top views of pixel structure layer in FIG. 8 when at the first driving sequence. FIG. 9B is a drawing, schematically illustrating top views of pixel structure layer in FIG. 8 when at the second driving sequence. In addition, to easily describe, only the color pixel structure, scanning line and data line in the display unit are shown in FIG. 9A and FIG. 9B. One with ordinary skill in the art can understand that the display unit can further include control device, light emitting device, power line and/or other devices.

Referring to FIG. 9A, in the first driving sequence, the driving voltages are applied to the scanning lines SL'1-SL'4, the first data lines DL'11-DL'13, the second data lines DL'21-DL'23, and the third data lines DL'31-DL'33 to drive the corresponding first, second, and third color pixel structures P'1-P'3, to cause the display unit in the row A1, the display unit in the row A2, the display unit in the row A3 and the display unit in the row A4 to emit light.

Referring to FIG. 9B, Referring to FIG. 5B, in the second driving sequence, two adjacent scanning lines form as a virtual scanning line, and the first, second, and third color pixel structures P'1-P'3 are driven by the virtual scanning line with the first, second, and third data lines, to form auxiliary display unit ADU'. In better detail, during the second driving sequence, the virtual scanning line DSL'1 can be formed by applying voltages to the scanning line SL'1 and the scanning line SL'2; the virtual scanning line DSL'2 can be formed by applying voltages to the scanning line SL'2 and the scanning line SL'3; and the virtual scanning line DSL'3 can be formed by applying voltages to the scanning line SL'3 and the scanning line SL'4. In the second driving sequence, all the color pixel structures P'1-P'3 in the rows B1-B3 can be driven by the foregoing virtual scanning lines DSL'1-DSL'3, the first data lines DL'11-DL'12, the second data lines DL'21-DL'23, and the third data lines DL'31-

DL'33, so a plurality of auxiliary display units ADU can be formed in the rows B'1-B'3. The first, second, and third pixel structures P'1-P'3 in each auxiliary display unit ADU' are formed by one first color pixel structure P'1, one second color pixel structure P'2 and one third color pixel structure P'3 respectively from the three adjacent display units.

As described above, in the second embodiment, since all the data lines can be implemented in the color light area formed from each of the color pixel structures P'1-P'3, the transparency of the transparent display panel can be further increased.

As to the foregoing descriptions, the transparent display panel of the invention can form the auxiliary display unit by the color pixel structures of the display unit. Further, based on the diving sequence in the invention, the display unit and the auxiliary display unit can be driven. The pixel density of the transparent display panel can be increased. Further, since the color light area and the transparent areas of the display unit in the invention can also be gathered accordingly, the transparent display panel can have both high pixel density and better transparency. In addition, sine the control device, the light emitting device and the data lines in the invention can hide in the color pixel structure, so the transparency of the transparent display panel can be further improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A transparent display panel, comprising:
   a transparent substrate;
   a plurality of display units, disposed on the transparent substrate, each of the display units including a color light area and at least one transparent area disposed around the color light area, wherein the color light area has a geometric center, a first color pixel structure, a second color pixel structure and a third color pixel structure, wherein the first, second and third color pixel structures take the geometric center as a center and are disposed with respect to the center as a radial structure to form the color light area;
   a plurality of scanning lines; and
   a plurality of first data lines, a plurality of second data lines, and a plurality of third data lines, wherein the first color pixel structures are electrically connected to one of the scanning lines and one of the first data lines, the second color pixel structures are electrically connected to one of the scanning lines and one of the second data lines, the third color pixel structures are electrically connected to one of the scanning lines and one of the third data lines, in each of the display unit, the first color pixel structure, the second color pixel structure, and the third color pixel structure are electrically connected to a same one of the scanning lines,
   wherein when driving the first, second, and third color pixel structures of each display unit in a first driving sequence via one of the scanning lines with the first, second, and third data lines, the corresponding display units emit light; and
   when forming a virtual scanning line from adjacent two of the scanning lines in a second driving sequence and driving the first, second, and third color pixel structures via the virtual scanning lines with the first, second, and third data lines, a plurality of auxiliary display units are formed,
   wherein each of the auxiliary display units comprises one first color pixel structure, one second color pixel structure, and one third color pixel structure,
   wherein the first, second, and third color pixel structures of each of the auxiliary display units are formed from adjacent three of the display units, each of which respectively provides one of the first, second, and third color pixel structures.

2. The transparent display panel of claim 1, wherein the first, second, and third pixel structures in three have a meeting point, and the geometric center matches to the meeting point.

3. The transparent display panel of claim 1, wherein,
   the first color pixel structure of each of the display units comprises a first control device and a first light emitting device electrically connected to the first control device, and the first control device is electrically connected with one of the scanning lines and one of the first data lines;
   the second color pixel structure of each of the display units comprises a second control device and a second light emitting device electrically connected to the second control device, and the second control device is electrically connected with one of the scanning lines and one of the second data lines; and
   the third color pixel structure of each of the display units comprises a third control device and a third light emitting device electrically connected to the third control device, and the third control device is electrically connected with one of the scanning lines and one of the third data lines.

4. The transparent display panel of claim 3, wherein the at least one transparent area of each of the display units is not implemented with any control device and light emitting device.

5. The transparent display panel of claim 3, wherein the first, second, and third data lines are disposed in the color light area.

6. The transparent display panel of claim 1, wherein a first end of each of the first, second, and third color pixel structures is gathered to a central location of the display unit with connection to one another, a second end of each of the first, second, and third color pixel structures is respectively connected to one of the first, second, and third color pixel structures from an adjacent one of the display units.

7. The transparent display panel of claim 6, wherein the first, second, and third color pixel structures of each of the display units are respectively connected with one of the first, second, and third color pixel structures of an adjacent one of the display units, to define a plurality of closed-form transparent areas.

8. The transparent display panel of claim 1, wherein at least one transparent area is formed between the color light area of each of the display units and the color light area of an adjacent one of the display units, so the color light area of one of the display units is not connected with the color light area of any adjacent one of the display units.

9. A transparent display panel, comprising:
   a transparent substrate;
   at least one first display unit, at least one second display unit, at least one third display unit, disposed on the transparent substrate, each of the first, second, and third display units comprising:

a first color pixel structure, a second color pixel structure, and a third color pixel structure, having a geometric center, wherein the first, second, and third pixel structures are disposed by a radial arrangement with respect to the geometric center, wherein the third color pixel structure of the first display unit, the second color pixel structure of the second display unit and the first color pixel structure of the third display unit form an display auxiliary display unit;

a plurality of scanning lines; and a plurality of first data lines, a plurality of second data lines, and a plurality of third data lines, wherein the first color pixel structures are electrically connected to one of the scanning lines and one of the first data lines, the second color pixel structures are electrically connected to one of the scanning lines and one of the second data lines, the third color pixel structures are electrically connected to one of the scanning lines and one of the third data lines, in each of the display unit, the first color pixel structure, the second color pixel structure, and the third color pixel structure are electrically connected to a same one of the scanning lines, wherein when driving the first, second, and third color pixel structures of each display unit in a first driving sequence via one of the scanning lines with the first, second, and third data lines, the corresponding display units emit light; and when forming a virtual scanning line from adjacent two of the scanning lines in a second driving sequence and driving the third color pixel structure of the first display unit, the second color pixel structure of the second display unit, and the first color pixel structure of the third display unit via the virtual scanning lines with the first, second, and third data lines, the auxiliary display unit is formed.

10. The transparent display panel of claim 9, wherein the first, second, and third pixel structures in three have a meeting point, and the geometric center matches to the meeting point.

11. The transparent display panel of claim 9, wherein the first display unit and the second display unit are located at a same row and the third display unit is located at a different row, the first, second, and third display units form a triangle.

12. The transparent display panel of claim 9, wherein an end of each of the third color pixel structure of the first display unit, the second color pixel structure of the second display unit and the first color pixel structure of the third display unit is connected to one another at a central location of the auxiliary display unit.

13. The transparent display panel of claim 12, wherein ends of the first, second, and third color pixel structures in each of the first, second, and third display units are connected to one another.

14. The transparent display panel of claim 12, wherein the first, second, and third color pixel structures of each of the first, second, and third display units are respectively connected to the first, second, and third color pixel structures in an adjacent one of the display units to define a plurality of closed-form transparent areas.

15. The transparent display panel of claim 9, wherein a transparent area is formed among an end of the third color pixel structure of the first display unit, an end of the second color pixel structure of the second display unit and an end of the first color pixel structure of the third display unit, and the transparent area is located at a central location of the auxiliary display unit.

16. The transparent display panel of claim 9, wherein:
the first color pixel structure in each of the first, second, and third display units comprises a first control device and a first light emitting device electrically connected to the first control device, and the first control device is electrically connected with one of the scanning lines and one of the first data lines;

the second color pixel structure in each of the first, second, and third display units comprises a second control device and a second light emitting device electrically connected to the second control device, and the second control device is electrically connected with one of the scanning lines and one of the second data lines; and the third color pixel structure in each of the first, second, and third display units comprises a third control device and a third light emitting device electrically connected to the third control device, and the third control device is electrically connected with one of the scanning line and one of the third data lines.

17. A driving method of transparent display panel, comprising:
providing a transparent display panel, comprising:
a plurality of scanning lines;
a plurality of first data lines, a plurality of second data lines, and a plurality of third data lines;
a plurality of first color pixel structures, electrically connected to one of the scanning lines and one of the first data lines;
a plurality of second color pixel structures, electrically connected to one of the scanning lines and one of the second data lines; and
a plurality of third color pixel structures, electrically connected to one of the scanning lines and one of the third data lines,
wherein one of the first color pixel structures, one of the second color pixel structures and one of the third color pixel structures are electrically connected to a same one of the scanning lines to form a display unit;

driving the first, second, and third color pixel structures of each display unit in a first driving sequence via one of the scanning lines with the first, second, and third data lines, to cause the corresponding display units to emit light; and forming a virtual scanning line from adjacent two of the scanning lines in a second driving sequence and driving the first, second, and third color pixel structures via the virtual scanning lines with the first, second, and third data lines to form a plurality of auxiliary display units, wherein each of the auxiliary display units comprises one first color pixel structure, one second color pixel structure, and one third color pixel structure, wherein the first, second, and third color pixel structures of each of the auxiliary display units are formed from adjacent three of the display units, each of which respectively provides one of the first, second, and third color pixel structures.

* * * * *